(12) United States Patent
Chung et al.

(10) Patent No.: US 11,245,061 B2
(45) Date of Patent: Feb. 8, 2022

(54) THERMOELECTRIC DEVICE HAVING A SEPARATE INTERLAYER DISPOSED BETWEEN A THERMOELECTRIC LEG AND AN ELECTRODE TO REDUCE THE CONTACT RESISTANCE THEREBETWEEN

(71) Applicant: KOREA INSTITUTE OF SCIENCE AND TECHNOLOGY, Seoul (KR)

(72) Inventors: Seungjun Chung, Seoul (KR); Phillip Lee, Seoul (KR); Min Park, Seoul (KR); Sang-Soo Lee, Seoul (KR); Heesuk Kim, Seoul (KR); Jeong Gon Son, Seoul (KR); Jong Hyuk Park, Seoul (KR); Tae Ann Kim, Seoul (KR); Seongkwon Hwang, Seoul (KR); Inho Jeong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 166 days.

(21) Appl. No.: 16/555,100

(22) Filed: Aug. 29, 2019

(65) Prior Publication Data
US 2020/0343429 A1    Oct. 29, 2020

(30) Foreign Application Priority Data
Apr. 26, 2019    (KR) .......................... 10-2019-0049276

(51) Int. Cl.
| | | |
|---|---|---|
| *H01L 35/12* | (2006.01) | |
| *H01L 35/02* | (2006.01) | |
| *H01L 35/34* | (2006.01) | |

(52) U.S. Cl.
CPC .............. *H01L 35/12* (2013.01); *H01L 35/02* (2013.01); *H01L 35/34* (2013.01)

(58) Field of Classification Search
None
See application file for complete search history.

(56) References Cited

U.S. PATENT DOCUMENTS

| | | | |
|---|---|---|---|
| 2019/0181320 A1* | 6/2019 | Yazawa .................. | H01L 35/24 |
| 2021/0143307 A1* | 5/2021 | Fletcher ................. | H01L 35/08 |

FOREIGN PATENT DOCUMENTS

| | | |
|---|---|---|
| JP | 2009260173 A | 11/2009 |
| JP | 2012-253178 A | 12/2012 |

(Continued)

OTHER PUBLICATIONS

Arita et al., "Chain-mixing behavior at interface between polystyrene brushes and polystyrene matrices", 2013, Polymer Journal, 45, pp. 117-123. (Year: 2013).*

(Continued)

*Primary Examiner* — Daniel P Malley, Jr.
(74) *Attorney, Agent, or Firm* — Rabin & Berdo, P.C.

(57) ABSTRACT

Disclosed is a thermoelectric device in which a separate interlayer is inserted between a thermoelectric leg and an electrode to reduce the contact resistance between the thermoelectric leg and the electrode, so that the interlayer serves as a tunneling path between the thermoelectric leg and the electrode, facilitating the charge movements between the two materials. The thermoelectric device according to an embodiment includes a substrate; at least one thermoelectric leg positioned on the substrate; an interlayer positioned on each thermoelectric leg of the at least one thermoelectric leg and including a plurality of interlayer materials that are chemically bonded with a respective thermoelectric leg; and an electrode positioned on each interlayer and electrically connected to the respective thermoelectric leg, wherein the plurality of interlayer materials of each respective interlayer is arranged in a shape of a brush.

5 Claims, 12 Drawing Sheets

(56) References Cited

FOREIGN PATENT DOCUMENTS

| JP | 2017162911 A | 9/2017 |
|---|---|---|
| KR | 1020120115079 A | 10/2012 |
| KR | 10-1631042 B1 | 6/2016 |
| KR | 10-1893660 B1 | 8/2018 |
| WO | 2010111462 A2 | 9/2010 |

OTHER PUBLICATIONS

Kazuhiro Kirihara et al., "Reduction of specific contact resistance between the conducting polymer PEDOT:PSS and a metal electrode by addition of a second solvent during film formation and a post-surface treatment", Synthetic Metals, 2018, pp. 289-296, vol. 246.

Kipyo Hong et al., "Reducing the contact resistance in organic thin-film transistors by introducing a PEDOT:PSS hole-injection layer", Organic Electronics, 2008, pp. 864-868, vol. 9.

Patrick J. Taylor et al., "Controlled improvement in specific contact resistivity for thermoelectric materials by ion implantation", Applied Physics Letters, 2013, pp. 043902-1~043902-4, vol. 103.

Bolin Chen et al., "Flexible thermoelectric generators with inkjet-printed bismuth telluride nanowires and liquid metal contacts", Nanoscale, 2018, The Royal Society of Chemistry, DOI: 10.1039/c8nr09101c.

* cited by examiner

THERMOELECTRIC DEVICE HAVING A SEPARATE INTERLAYER DISPOSED BETWEEN A THERMOELECTRIC LEG AND AN ELECTRODE TO REDUCE THE CONTACT RESISTANCE THEREBETWEEN

CROSS-REFERENCE TO RELATED APPLICATION

This application claims priority to Korean Patent Application No. 10-2019-0049276, filed on Apr. 26, 2019, and all the benefits accruing therefrom under 35 U.S.C. § 119, the contents of which in its entirety are herein incorporated by reference.

STATEMENT REGARDING SPONSORED RESEARCH

This study was supported by an individual basic research project of the Ministry of Science and ICT (Development of large area wearable molybdenum disulfide photo sensor array using printing technology, Project No. 1711087699) under the superintendence of National Research Foundation of Korea.

BACKGROUND

1. Field

The present disclosure relates to a thermoelectric device with improved properties of the device through the reduction of contact resistance and a method for manufacturing the same.

2. Description of the Related Art

Thermoelectric conversion refers to energy conversion between thermal energy and electrical energy. Typically, thermoelectric conversion involves the Peltier effect that a temperature different is created across a thermoelectric material in which the current flows, and to the contrary, the Seebeck effect that electricity is generated when there is temperature difference across a thermoelectric material. Using the Seebeck effect, heat generated from computers, automobile engines and industrial plants can be converted into electrical energy. Thermoelectric power generation using the Seebeck effect can be used as a new regenerative energy source. Recently, with the increasing interest in new energy development, waste energy recovery and environmental protection, there is a growing interest in thermoelectric devices.

In general, a thermoelectric device includes a substrate, electrodes and thermoelectric legs, and the thermoelectric legs are arranged in an array and the electrodes are connected through the thermoelectric legs. The thermoelectric legs and the electrodes have poor wetting properties due to the material problem, and because there is a high energy barrier between the thermoelectric legs and the electrodes, high energy is required for charges to move. As described above, because contact resistance between the thermoelectric legs and the electrodes is high, the total internal resistance increases and the thermoelectric properties degrade, and thus an amount of power generated by the thermoelectric device reduces.

SUMMARY

The present disclosure is aimed at inserting a separate interlayer between a thermoelectric leg and an electrode to reduce the contact resistance between the thermoelectric leg and the electrode, so that the interlayer serves as a tunneling path between the thermoelectric leg and the electrode, facilitating the charge movements between the two materials.

The present disclosure is aimed at implementing a thermoelectric device that reduces the contact resistance between the thermoelectric leg and the electrode, and through this, reduces the total resistance of the thermoelectric device and thus obtains a higher amount of generated power.

The technical problem of the present disclosure is not limited to those mentioned above, and other technical problems not mentioned herein will be clearly understood by those skilled in the art from the following description.

A thermoelectric device according to an embodiment of the present disclosure includes a substrate, a thermoelectric leg positioned on the substrate, an interlayer positioned on the thermoelectric leg, and including a plurality of interlayer materials chemically bonded with the thermoelectric leg, and an electrode positioned on the interlayer, and electrically connected to the thermoelectric leg.

In an embodiment, the thermoelectric leg may be a P-type thermoelectric leg, and may be made of a heat conducting polymer material.

In an embodiment, the thermoelectric leg may be made of poly(3,4-ethylenedioxythiophene):polystyrene sulfonate (PEDOT:PSS).

In an embodiment, the interlayer materials may be arranged in a shape of a brush.

In an embodiment, the interlayer materials may comprise polystyrene polymer.

In an embodiment, the interlayer materials may comprise a polymer material which is chemically bonded with the PSS and has polystyrene.

In an embodiment, the thermoelectric leg and the electrode may be electrically connected using the interlayer materials as a tunneling path.

In an embodiment, the thermoelectric leg may have arrangement with spacing along a widthwise direction of one surface of the substrate.

A method for manufacturing a thermoelectric device according to an embodiment of the present disclosure includes forming a thermoelectric leg on a substrate through a spray coating process, forming an interlayer on the thermoelectric leg through a solution process, annealing and rinsing a thermoelectric device having the interlayer, and forming an electrode on the interlayer of the rinsed thermoelectric device through a solution process.

In an embodiment, the thermoelectric leg may be made of PEDOT:PSS, the interlayer may include silane terminated polystyrene polymer, and the forming the interlayer may include forming interlayer materials through a chemical bond between the thermoelectric leg and the polystyrene polymer.

In an embodiment, the forming the interlayer may include forming the interlayer materials through a chemical bond between sulfur trioxide ion ($SO_3^-$) included in the PSS and the silane.

In an embodiment, the annealing and rinsing the thermoelectric device having the interlayer may include arranging the interlayer materials in a shape of a brush, and removing a remaining polystyrene polymer unbonded with the thermoelectric leg.

The thermoelectric device according to the present disclosure has the reduced total resistance of the thermoelectric device and can obtain a higher amount of generated power, achieving good performance.

Additionally, according to the present disclosure, it is possible to produce thermoelectric devices on large scale at low process cost by using a solution process.

The effects of the present disclosure are not limited to those mentioned above, and other effects not mentioned herein will be clearly understood by those skilled in the art from the disclosure of the appended claims.

DETAILED DESCRIPTION

Figure 1:
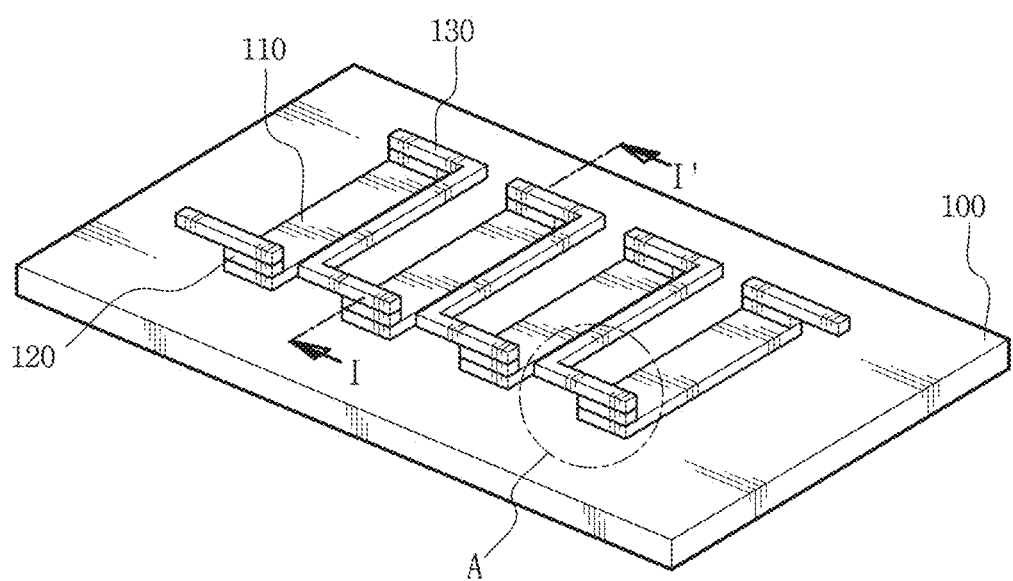
FIG. 1 is a perspective view showing the structure of a thermoelectric device according to an embodiment of the present disclosure.

Hereinafter, exemplary embodiments of the present disclosure will be described with reference to the accompanying drawings. The present disclosure is described with reference to the embodiments shown in the drawings, but this is described as an embodiment, and the technical spirit of the present disclosure and its key elements and operation are not limited thereby.

Figure 2:
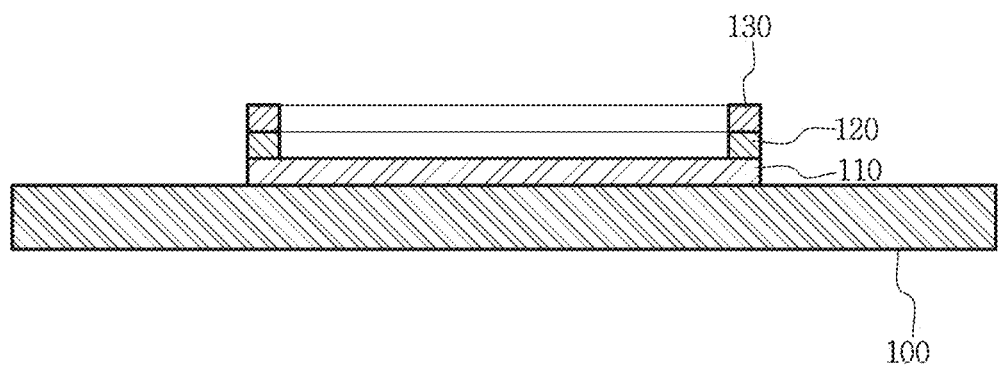
FIG. 2 is a cross-sectional view taken along the line I-I' of FIG. 1.

FIG. 1 is a perspective view showing the structure of a thermoelectric device according to an embodiment of the present disclosure, and FIG. 2 is a cross-sectional view taken along the line I-I' of FIG. 1.

Referring to FIGS. 1 and 2, the thermoelectric device includes a substrate 100, a thermoelectric leg 110, an interlayer 120 and an electrode 130.

The substrate 100 may be an insulating substrate or a metal substrate. The insulating substrate may be an aluminum substrate or a flexible polymer resin substrate. The flexible polymer resin substrate may include various types of insulating resin materials of high transmittance plastic such as polyimide (PI), polystyrene (PS), polymethylmethacrylate (PMMA) and resin. Alternatively, the insulating substrate may be a fabric. The metal substrate may include Cu, Cu alloys or Cu—Al alloys. Here, when the substrate 100 is a metal substrate, the thermoelectric device may further include a dielectric layer between the substrate 100 and the electrode 130.

The substrate 100 may have a heat dissipation pattern, for example, a concave and convex pattern, on the surface. Accordingly, it is possible to increase the heat dissipation performance of the thermoelectric device. When the concave and convex pattern is formed on the contact surface with the thermoelectric leg 110, the bonding properties of the thermoelectric leg 110 and the substrate 100 may be improved.

The thermoelectric leg 110 is positioned on the substrate 100. The thermoelectric leg 110 may have a shape of a polygonal prism as shown in FIG. 1, but is not limited thereto. The thermoelectric leg 110 may be formed in a circular or oval cylindrical shape.

The thermoelectric leg 110 may be any thermoelectric material that can be solution-processed, for example, poly (3,4-ethylenedioxythiophene):polystyrene sulfonate (PEDOT:PSS), polyacetylene, polyaniline, polypyrrole, polythiophene, polycarbazole and carbon nanotube, and the thermoelectric leg 110 may be PEDOT:PSS.

The thermoelectric leg 110 may have arrangement with spacing along a widthwise direction of one surface of the substrate 100. Accordingly, holes and electrons may flow along the thermoelectric material line.

The interlayer 120 is positioned on the thermoelectric leg 110. The interlayer 120 may be made of silane terminated polystyrene polymer. A detailed structure of the interlayer 120 will be described below.

The electrode 130 is positioned on the interlayer 120. As shown in FIG. 1, the electrode 130 may be formed at two ends of the thermoelectric leg 110 having arrangement with spacing, to electrically connect the thermoelectric leg 110 having arrangement with spacing. The electrode 130 may have a shape of a polygonal prism, but is not limited thereto.

The electrode 130 may be made of titanium (Ti), gold (Au), silver (Ag), nickel (Ni), copper (Cu), platinum (Pt), chrome (Cr), aluminum (Al), zinc (Zn) and iron (Fe), and the electrode 130 may be silver (Ag) formed by a solution process.

Electricity is generated due to a temperature difference created at the two end parts of the thermoelectric leg 110 where the thermoelectric leg 110 and the electrode 130 contact each other. The power of the generated electricity is proportional to the Seebeck coefficient and the temperature difference, and is inversely proportional to the internal resistance and the resistance at the contact surface, and accordingly, the reducing the resistance at the contact surface is advantageous for increased efficiency of the thermoelectric device.

Although an embodiment shows that the thermoelectric device has four thermoelectric legs 110 and electrodes 130 each electrically connecting the four thermoelectric legs 110, the number of thermoelectric legs 110 in the thermoelectric device is not limited thereto, and may change depending on applications in which the thermoelectric device is used, for the benefit of maximum efficiency.

Figure 3:
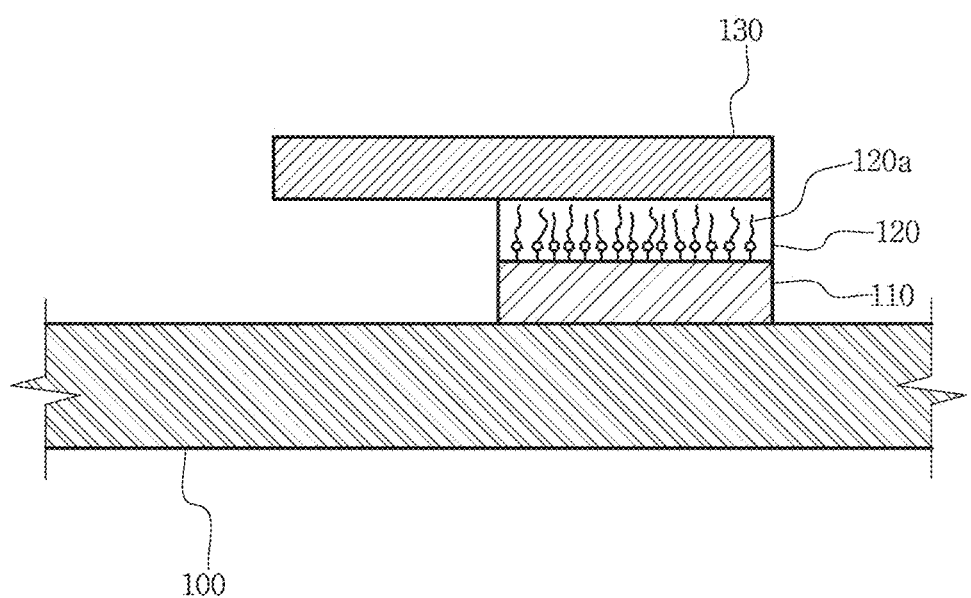
FIG. 3 is an enlarged view of section A of FIG. 1 to illustrate an interlayer according to an embodiment.

FIG. 3 is an enlarged view of section A of FIG. 1 to illustrate the interlayer according to an embodiment. Hereinafter, redundant descriptions of the above-described elements will be omitted herein.

Referring to FIG. 3, the interlayer 120 includes a plurality of polystyrene (PS) polymers arranged in the shape of a brush. The PS polymers may be terminated by silane at the insertion step of the interlayer 120. Silane can be chemically bonded with sulfur trioxide ions ($SO_3^-$) included in the thermoelectric leg 110, and when chemical bonds are formed between the PS polymers and the sulfur trioxide ions ($SO_3^-$), a surface of the interlayer 120 that contacts the electrode 130 becomes PS. As described above, the interlayer 120 includes a plurality of PS polymers, and may have a structure in which the plurality of PS polymers is arranged in the shape of a brush, with the surface being PS through chemical bonds with part of the thermoelectric leg 110. In the specification, the PS polymers having the PS surface in the shape of a brush is referred to as an interlayer material 120a.

The interlayer material 120a may serve as a tunneling path between the thermoelectric leg 110 and the electrode 130. The interlayer material 120a may be a path in which electrons can move within the barrier between the thermoelectric leg 110 and the electrode 130. There is a high probability that the electrons will pass through the barrier via the interlayer material 120a, for example, like crossing stepping stones, and charge movements between the thermoelectric leg 110 and the electrode 130 are made easy by the tunneling effect.

As described above, the present disclosure can facilitate the charge movements between the thermoelectric leg 110 and the electrode 130 through the interlayer 120, thereby reducing the contact resistance between the thermoelectric leg 110 and the electrode 130. Originally, the thermoelectric leg and the electrode have bad wetting properties due to the material problem. Specifically, wetting properties between an organic thermoelectric leg and an electrode are not good in a solution process, and thus the contact resistance is high. However, the present disclosure can reduce the contact resistance between the thermoelectric leg 110 and the electrode 130 through the interlayer 120, and when the contact resistance is low, the total internal resistance of the thermoelectric device is also low, and thus an amount of power generated by the thermoelectric device increases, thereby realizing the thermoelectric device with good performance.

FIGS. 4A to 4D are schematic diagrams showing a method for manufacturing a thermoelectric device according to an embodiment. FIGS. 4A to 4D schematically show the method for manufacturing a thermoelectric device, and a detailed structure will be described in combination with FIGS. 5A to 5C.

Figure 4A:
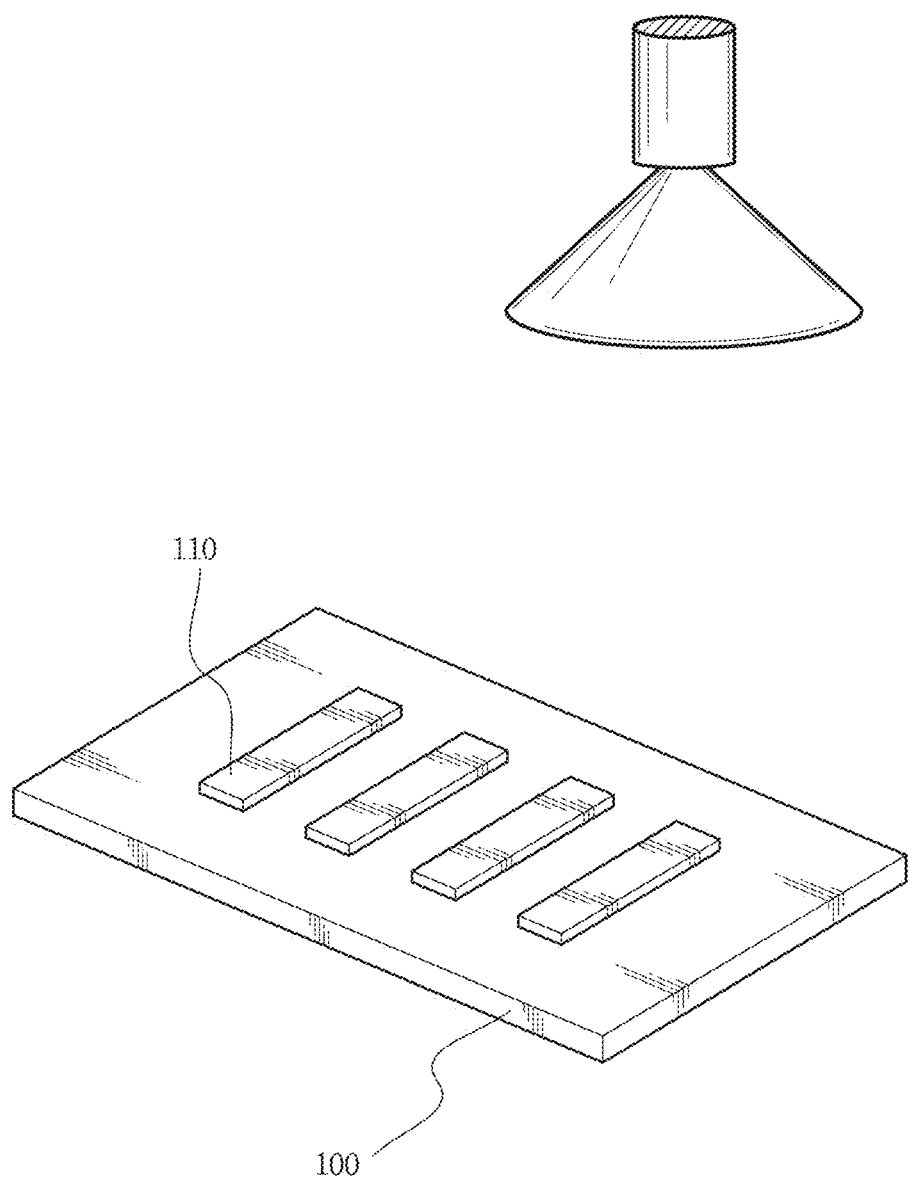
FIGS. 4A to 4D are schematic diagrams showing a method for manufacturing a thermoelectric device according to an embodiment.

Referring to FIG. 4A, the thermoelectric leg 110 is formed on the substrate 100. The thermoelectric leg 110 may be formed on the substrate 100 through a spray coating process. Although FIG. 4A shows four thermoelectric legs 110 formed on the substrate 100, the number of thermoelectric legs 110 is not limited thereto and may change depending on applications in which the thermoelectric device is used.

Figure 4B:
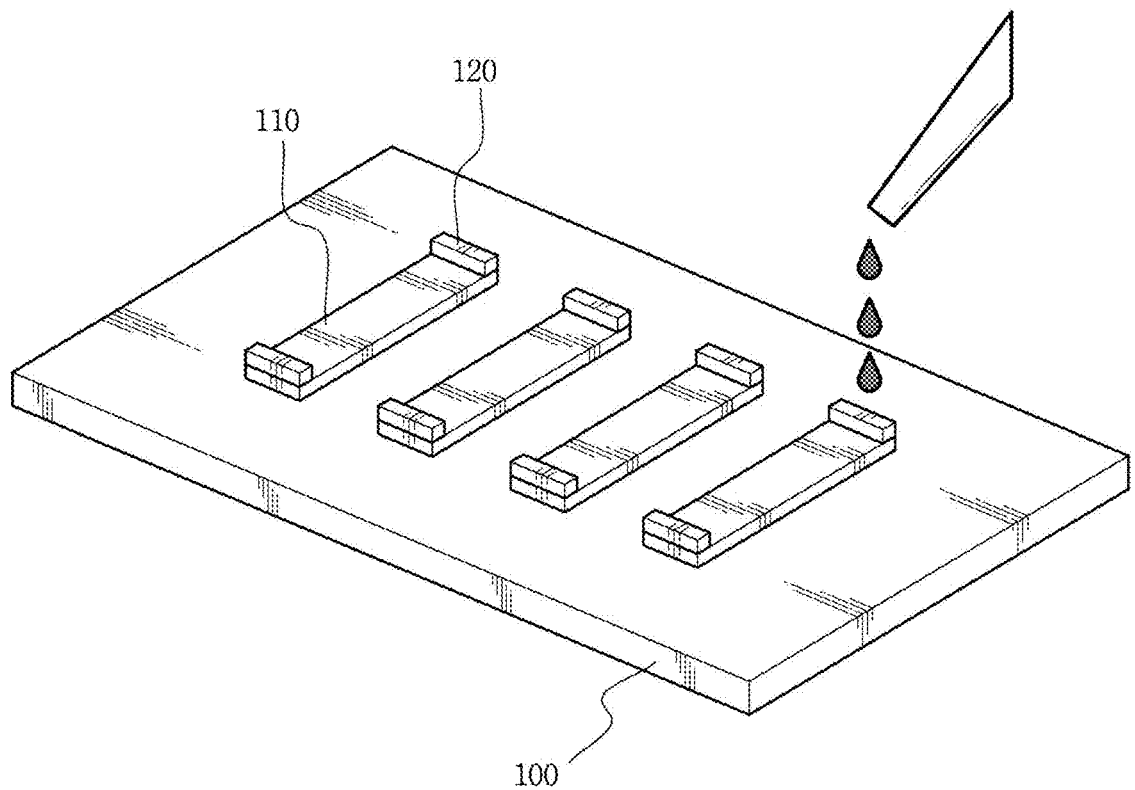

Referring to FIG. 4B, the interlayer 120 is formed on the thermoelectric leg 110. The interlayer 120 may be formed on two ends of the thermoelectric leg 110 through a solution process. While the interlayer 120 is formed, chemical bonds with the thermoelectric leg 110 may be formed, and its description will be provided below.

Figure 4C:
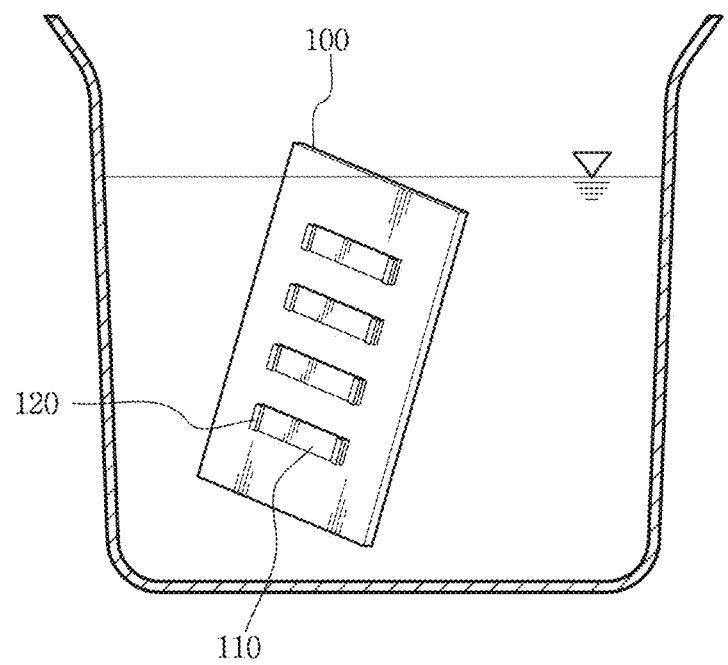

Referring to FIG. 4C, after the interlayer 120 is formed, annealing and rinsing processes of the thermoelectric device are performed. The annealing process may be performed at 100° C. for about 1.5 hours, and the rinsing process is performed after the annealing process. Through this, the interlayer 120 may have an arrangement structure in the shape of a brush.

Figure 4D:
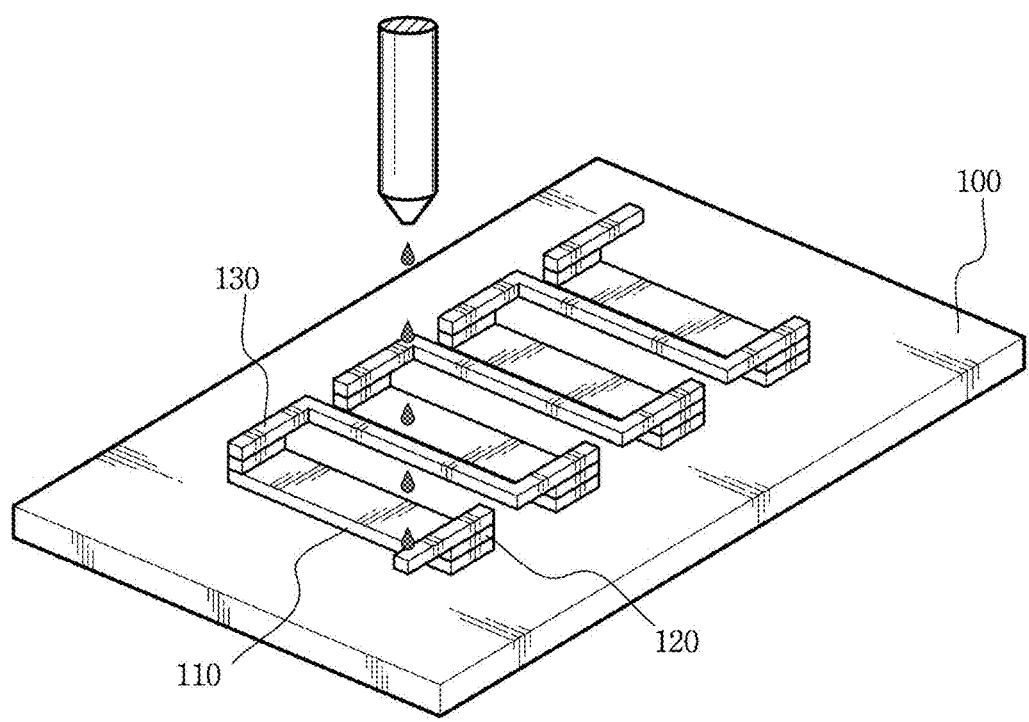

Referring to FIG. 4D, the electrode 130 is formed on the interlayer 120. The electrode 130 is formed on the interlayer 120 through a solution process, for example, an inkjet process. The electrode 130 may have a shape of a polygonal prism to electrically connect the thermoelectric leg 110 having arrangement with spacing, but is not limited thereto.

Figure 5A:
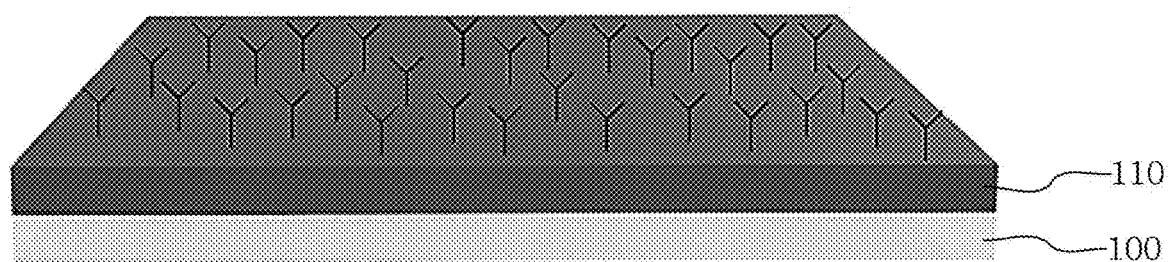
FIGS. 5A to 5C are schematic diagram showing a process in which an interlayer is formed on a thermoelectric leg according to an embodiment.
Figure 5B:
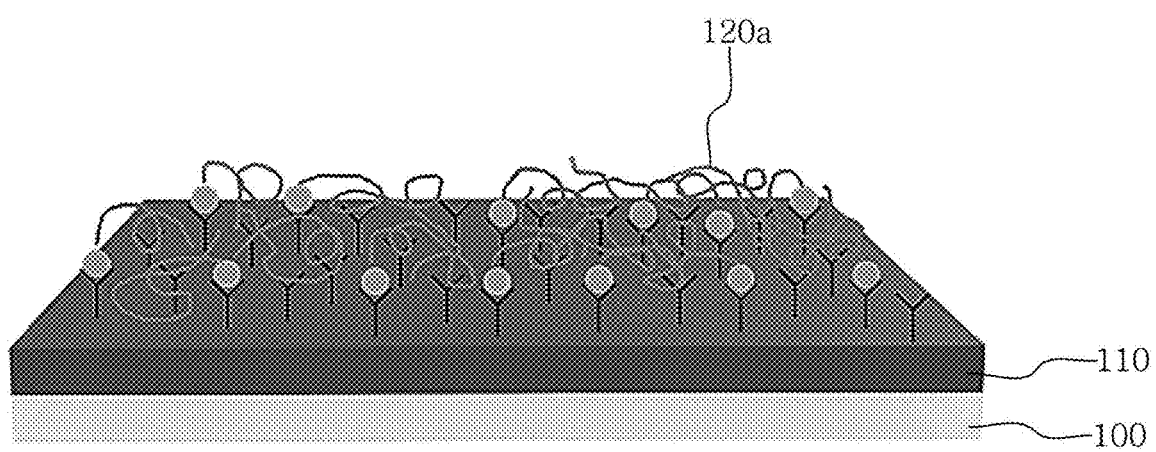
Figure 5C:
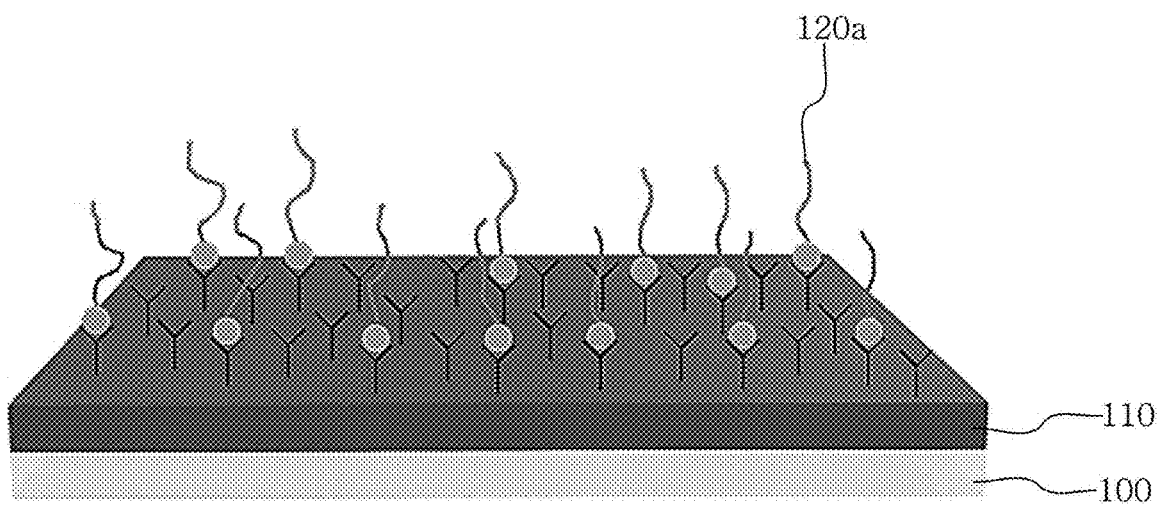

FIGS. 5A to 5C are schematic diagram showing a process in which the interlayer is formed on the thermoelectric leg according to an embodiment.

Referring to FIG. 5A, the thermoelectric leg 110 is formed on the substrate 100. Here, the thermoelectric leg 110 may be made of PEDOT:PSS. The PEDOT:PSS includes PSS of the following chemical formula 1, and the PSS has $SO_3^-$. In the PSS, the $SO_3^-$ is positioned at the surface end of the thermoelectric leg 110, and accordingly, it is easy to form chemical bonds with the PS polymers of the interlayer 120. FIG. 5A may correspond to FIG. 4A.

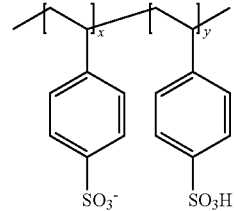

[Chemical formula 1]

Referring to FIG. 5B, the PS polymers of the following chemical formula 2 are bonded onto the thermoelectric leg 110. That is, chemical bonds are formed between the $SO_3^-$ included in the PSS of the PEDOT:PSS and silane of the PS polymers. The silane refers collectively to compounds having Si, and chemical bonds may be formed between silane and $SO_3^-$, producing hydrogen chloride (HCl). As described above, the chemically bonded material corresponds to the interlayer materials 120a. Here, FIG. 5B may correspond to FIG. 4B.

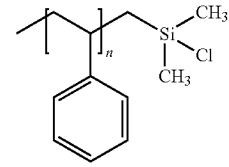

[Chemical formula 2]

Referring to FIG. 5C, the interlayer materials 120a are arranged in the shape of a brush through annealing and rinsing processes. In FIG. 5B, the PS polymers bonded with the PSS are arranged in the shape of a brush such that PS is positioned at the surface end of the interlayer 120, and PS polymer not bonded with the PSS is removed. As described above, the interlayer materials 120a arranged in the shape of a brush may serve as a tunneling path between the thermoelectric leg 110 and the electrode 130, and as described above, charge movements between the thermoelectric leg 110 and the electrode 130 may be made easy by the tunneling effect.

Figure 6A:
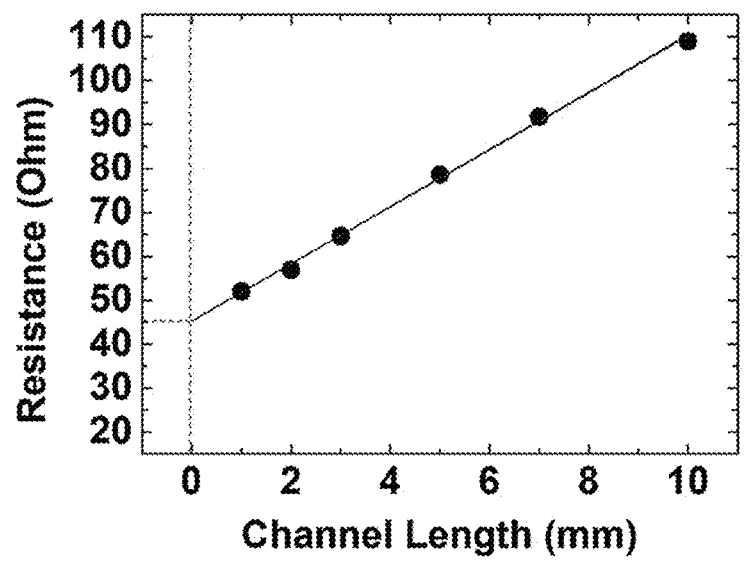
FIGS. 6A and 6B are graphs showing the resistance properties of a thermoelectric device according to the related art and a thermoelectric device according to an embodiment.
Figure 6B:
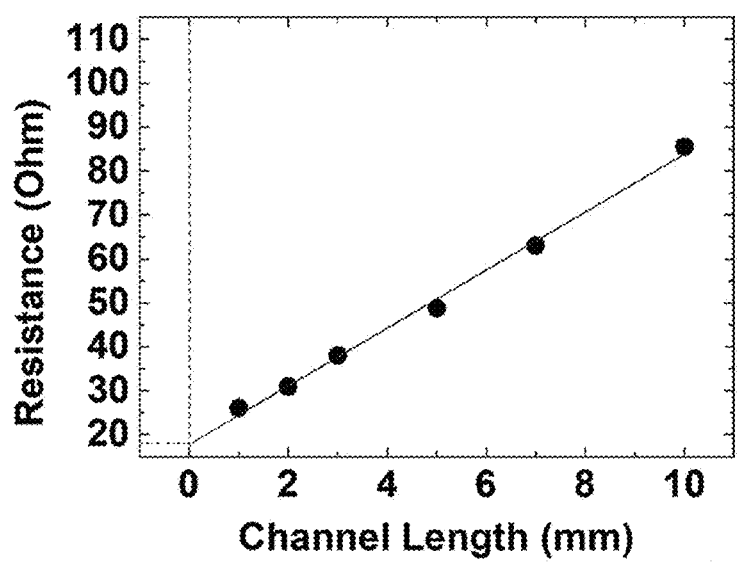

FIGS. 6A and 6B are graphs showing the resistance properties of the thermoelectric device according to the related art and the thermoelectric device according to an embodiment. Here, the x axis indicates the channel length, and the y axis indicates resistance between the thermoelectric leg 110 and the electrode 130 as a function of the channel length. FIG. 6A is a graph showing contact resistance between the thermoelectric leg 110 and the electrode 130 in the thermoelectric device according to the related art, and FIG. 6B is a graph showing resistance between the thermoelectric leg 110 and the electrode 130 in the thermoelectric device according to the present disclosure. Because FIGS. 6A and 6B are graphs showing the resistance between the thermoelectric leg 110 and the electrode 130 at two ends of the thermoelectric leg 110, it is possible to measure the contact resistance occurring between one end of the thermoelectric leg 110 and the electrode 130.

Referring to FIG. 6A, it can be seen that the resistance between the thermoelectric leg 110 and the electrode 130 is about 56 ohm when the channel length is 2 mm. Here, because the internal resistance is about 10 ohm when the channel length is 2 mm, it can be seen that the contact resistance between the thermoelectric leg 110 and the electrode 130 at two ends of the thermoelectric leg 110 is about 46 ohm, and the contact resistance between the thermoelectric leg 110 and the electrode 130 at one end of the thermoelectric leg 110 is about 23 ohm.

Referring to FIG. 6B, it can be seen that the resistance between the thermoelectric leg 110 and the electrode 130 is about 30 ohm when the channel length is 2 mm. Here, because the internal resistance is about 10 ohm when the channel length is 2 mm, it can be seen that the contact resistance between the thermoelectric leg 110 and the electrode 130 at two ends of the thermoelectric leg 110 is about 20 ohm, and the contact resistance between the thermoelectric leg 110 and the electrode 130 at one end of the thermoelectric leg 110 is about 10 ohm.

As described above, the thermoelectric device according to the present disclosure can reduce the contact resistance between the thermoelectric leg 110 and the electrode 130, thereby reducing the total internal resistance of the thermoelectric device, and accordingly, increasing an amount of power generated by the thermoelectric device.

Figure 7A:
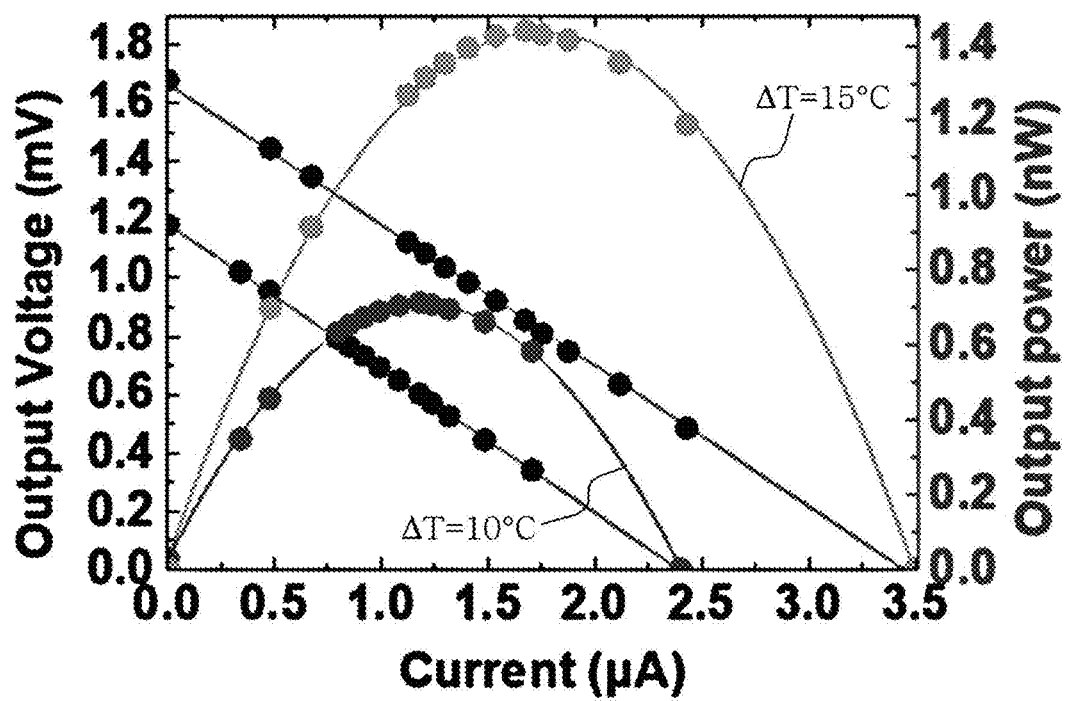
FIGS. 7A and 7B are graphs showing the power properties of a thermoelectric device according to the related art and a thermoelectric device according to an embodiment.
Figure 7B:
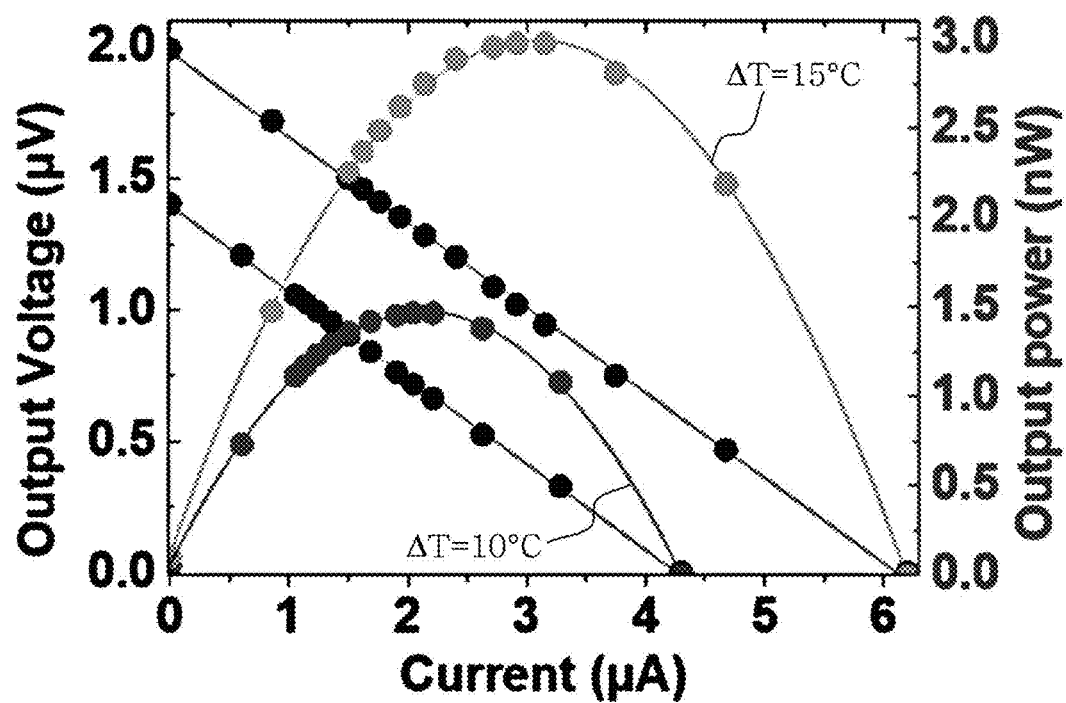

FIGS. 7A and 7B are graphs showing the power properties of the thermoelectric device according to the related art and the thermoelectric device according to an embodiment. Here, the x axis indicates the current, and the y axis indicates the output voltage and the output power. FIG. 7A is a graph showing the output power of the thermoelectric device according to the related art, and FIG. 7B is a graph showing the output power of the thermoelectric device according to the present disclosure.

Referring to FIG. 7A, it can be seen that the thermoelectric device according to the related art has the output power of about 0.713 nW when the temperature difference is 10° C., and the output power of about 1.466 nW when the temperature difference is 15° C.

Referring to FIG. 7B, it can be seen that the thermoelectric device according to the present disclosure has the output power of about 1.441 nW when the temperature difference is 10° C., and the output power of about 2.977 nW when the temperature difference is 15° C.

As described above, it can be seen that the thermoelectric device generates more power as the temperature difference is larger. Additionally, it can be seen that the thermoelectric device according to the present disclosure outputs power that is about twice more than the thermoelectric device according to the related art at the same temperature difference. It can be seen that this is because the thermoelectric device according to the present disclosure can reduce the contact resistance between the thermoelectric leg 110 and the electrode 130 through the interlayer 120, thereby reducing the internal resistance and increasing an amount of power generated by the thermoelectric device.

While the present disclosure has been hereinabove described with reference to the embodiments shown in the drawings, this is provided for illustration purposes only and it will be appreciated by those having ordinary skill in the technical field pertaining to the present disclosure that various modifications and variations may be made thereto. However, it should be noted that such modifications fall within the technical protection scope of the present disclosure. Therefore, the true technical protection scope of the present disclosure should be defined by the technical spirit of the appended claims.

| [Detailed Description of Main Elements] | |
|---|---|
| 100: Substrate | 110: Thermoelectric leg |
| 120: Interlayer | 120a: Interlayer material |
| 130: Electrode | |

What is claimed is:

1. A thermoelectric device, comprising:
   a substrate;
   at least one thermoelectric leg positioned on the substrate;
   an interlayer positioned on each thermoelectric leg of the at least one thermoelectric leg and including a plurality of interlayer materials that are chemically bonded with a respective thermoelectric leg; and
   an electrode positioned on each interlayer and electrically connected to the respective thermoelectric leg,
   wherein the at least one thermoelectric leg is a P-type thermoelectric leg and is made of a polymer material that conducts heat, and
   wherein the plurality of interlayer materials of each respective interlayer comprises a polystyrene polymer terminated with silane and is arranged in a shape of a brush.

2. The thermoelectric device according to claim 1, wherein the at least one thermoelectric leg is made of poly(3,4-ethylenedioxythiophene):polystyrene sulfonate (PEDOT:PSS).

3. The thermoelectric device according to claim 2, wherein the plurality of interlayer materials of each respective interlayer comprises the polystyrene polymer which is chemically bonded with the PEDOT:PSS.

4. The thermoelectric device according to claim 1, wherein each thermoelectric leg and a respective electrode are electrically connected via a respective plurality of interlayer materials as a tunneling path.

5. The thermoelectric device according to claim 1, wherein the at least one thermoelectric leg is a plurality of thermoelectric legs which are disposed in a spaced-apart array that extends along a widthwise direction of one surface of the substrate.

* * * * *